(12) United States Patent
Ritchie et al.

(10) Patent No.: US 9,028,659 B2
(45) Date of Patent: May 12, 2015

(54) MAGNETRON DESIGN FOR EXTENDED TARGET LIFE IN RADIO FREQUENCY (RF) PLASMAS

(71) Applicant: Applied Materials, Inc., Santa Clara, CA (US)

(72) Inventors: Alan Ritchie, Menlo Park, CA (US); Zhenbin Ge, San Jose, CA (US); Tza-Jing Gung, San Jose, CA (US); Vivek Gupta, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/961,165

(22) Filed: Aug. 7, 2013

(65) Prior Publication Data

US 2014/0042023 A1 Feb. 13, 2014

Related U.S. Application Data

(60) Provisional application No. 61/680,548, filed on Aug. 7, 2012.

(51) Int. Cl.
*C23C 14/35* (2006.01)
*H01J 37/32* (2006.01)
*H01J 37/34* (2006.01)

(52) U.S. Cl.
CPC ............. *C23C 14/35* (2013.01); *H01J 37/3266* (2013.01); *H01J 37/3408* (2013.01); *H01J 37/3452* (2013.01)

(58) Field of Classification Search
CPC ...................................................... C23C 14/35
See application file for complete search history.

(56) References Cited

U.S. PATENT DOCUMENTS

| | | | | | |
|---|---|---|---|---|---|
| 4,631,106 | A | * | 12/1986 | Nakazato et al. | 156/345.46 |
| 6,132,576 | A | * | 10/2000 | Pearson | 204/298.2 |
| 2009/0026073 | A1 | * | 1/2009 | Harada et al. | 204/298.16 |

* cited by examiner

*Primary Examiner* — Jason M Berman
(74) *Attorney, Agent, or Firm* — Moser Taboada; Alan Taboada

(57) ABSTRACT

Embodiments of magnetrons suitable to provide extended target life in radio frequency (RF) plasmas are provided. In some embodiments, apparatus and methods are provided to control film uniformity while extending the target life in an RF plasma. In some embodiments, the present invention may facilitate one or more of very high target utilization, more uniform metal ionization, and more uniform deposition on a substrate. In some embodiments, a magnetron may include a magnet support member having a center of rotation; and a plurality of magnetic tracks, each track comprising a pair of open loop magnetic poles parallel to and spaced apart from each other, wherein one track is disposed near the center of the magnet support member, and wherein a different track is disposed in a position corresponding to an outer edge of a target material to be deposited on a substrate when installed in the PVD process chamber.

20 Claims, 2 Drawing Sheets

MAGNETRON DESIGN FOR EXTENDED TARGET LIFE IN RADIO FREQUENCY (RF) PLASMAS

CROSS-REFERENCE TO RELATED APPLICATIONS

This application claims benefit of U.S. provisional patent application Ser. No. 61/680,548, filed Aug. 7, 2012, which is herein incorporated by reference.

FIELD

Embodiments of the present invention generally relate to physical vapor deposition substrate processing systems.

BACKGROUND

Two approaches for depositing ionized metals include direct current physical vapor deposition (DC PVD) and radio frequency (RF) PVD. The DC PVD process is characterized by a spacing between a substrate support surface of a substrate support and an opposing target containing material to be deposited on a substrate supported by the substrate support of about 190 to about 400 mm, referred to herein as tall spacing. The DC PVD process further uses a small unbalanced magnetron in a closed loop and operates at a relatively low pressure and high power. The combination of small magnetron and high DC power generates a large power density to ionize the gas medium and sputter the target. The low pressure and tall spacing provide a 'ballistic' transport mechanism where sputter material can reach the wafer with few if any in-flight collisions. Additional neutral metal is mainly deposited on the shields due to cosine type distribution and the tall spacing.

However, the inventors have observed that the small strong magnetron has a large drawback of localized sputtering. This localized sputtering will quickly erode at certain locations due to the electron confinement and localized gas ionization. This effect is further accelerated when magnetic materials such as cobalt (Co) and nickel (Ni) and their alloys are sputtered. In such cases a very strong magnet is used as some of the magnetic flux will be shunted into the magnetic material of the target. As the target is eroded the effective magnetic field at the front face of the target increases, which further accelerates the process. One complex method currently used in DC PVD processes is to use a position controlled magnet which is capable of moving location to more efficiently erode a larger area of the target. However, the tall spacing still results in an inefficient process as most of the sputtered material is deposited on the shields or collimator if utilized.

RF PVD process chambers also use a tall spacing and driving frequency of 13.56-27.12 Mhz operated in a pressure regime of 20-60 mTorr. The inclusion of RF can open the window to increase target utilization without sacrificing metal ionization. For example, metal ionization is higher for RF PVD than DC PVD processes. Electron confinement is enhanced and consequently gas ionization by the confinement of electrons due to stochastic heating from the oscillating field is predominantly in the Ez direction. This permits greater flexibility of the type of magnetron that can be used. For example, the magnetron track in an RF PVD system does not need to be closed, unlike a DC PVD magnetron which does need to be closed. In addition, the RF PVD magnetron can be larger than the DC PVD magnetron and still achieve high metal ionization levels at the wafer.

However at 190 mm spacing the inventors have observed that in order to achieve good deposition uniformity, the magnetic field must be predominantly produced at the target edge. This poses an issue in that the target is predominantly eroded at the target edge and as mentioned previously with magnetic materials this effect is pronounced.

Accordingly, the inventors have provided embodiments of improved substrate supports for use in substrate processing systems.

SUMMARY

Embodiments of magnetrons suitable to provide extended target life in radio frequency (RF) plasmas are provided herein. In some embodiments, the present invention provides new apparatus and methods to control film uniformity whilst greatly extending the target life in an RF plasma. In some embodiments, the present invention may facilitate one or more of very high target utilization (e.g., 300-800% improvement as compared to target utilization in conventional DC PVD process chambers), more uniform metal ionization, and more uniform deposition on a substrate.

In some embodiments, a magnetron for use in a physical vapor deposition (PVD) process chamber may include a magnet support member having a center of rotation; and a plurality of magnetic tracks, each track comprising a pair of open loop magnetic poles that are parallel to and spaced apart from each other, wherein one track is disposed near the center of the magnet support member and wherein a different track is disposed in a position corresponding to an outer edge of a target material to be deposited on a substrate when installed in the PVD process chamber.

In some embodiments, a substrate processing system includes a process chamber having an inner volume and a substrate support disposed therein; a target assembly disposed in an upper portion of the inner volume opposing the substrate support; and a magnetron disposed proximate the target assembly on a side opposite the substrate support. The magnetron may be any of the embodiments disclosed herein.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
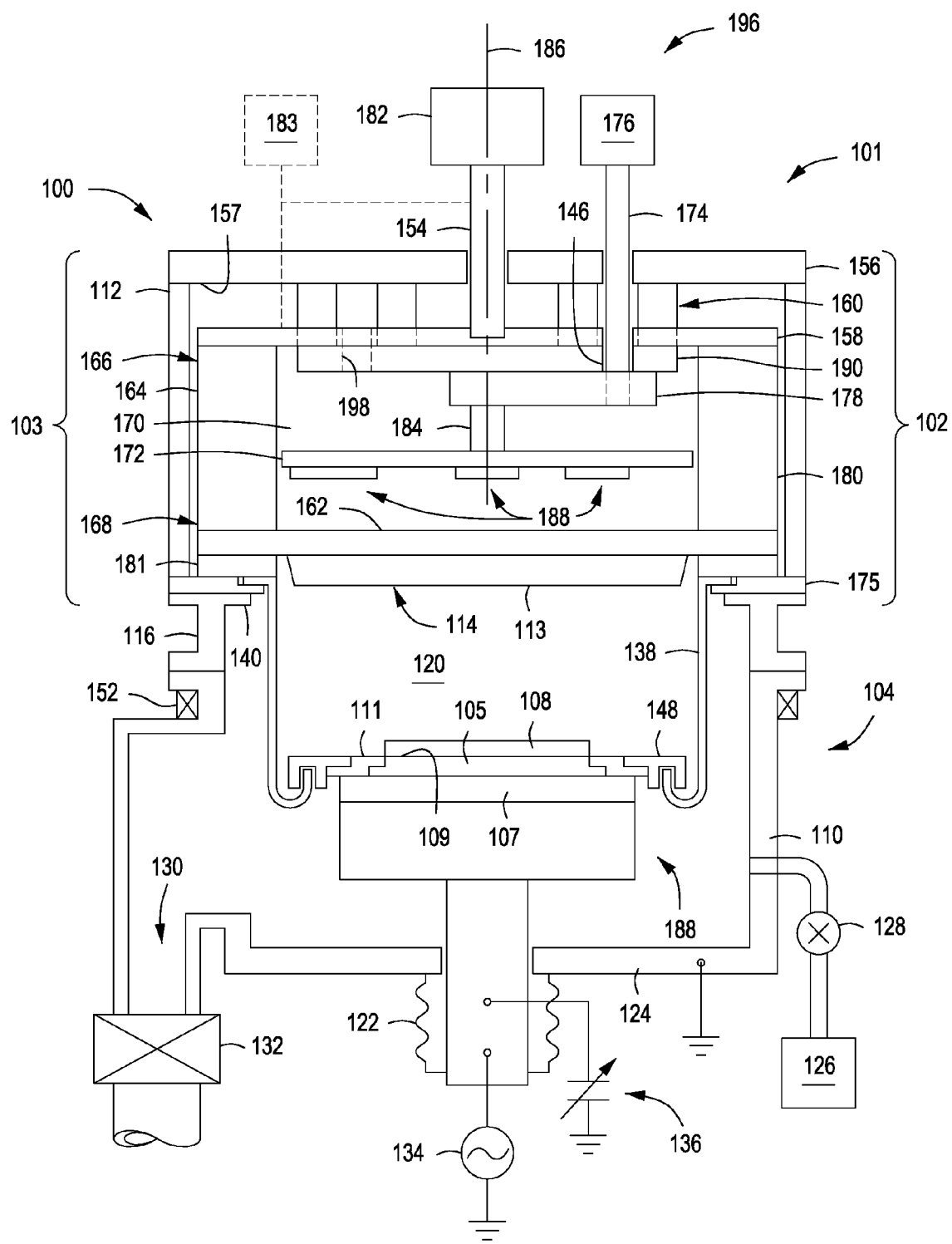
FIG. 1 depicts a schematic cross sectional view of a physical vapor deposition (PVD) process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of magnetrons suitable to provide extended target life in radio frequency (RF) plasmas are provided herein. In some embodiments, the present invention provides new apparatus and methods to control film uniformity whilst greatly extending the target life in an RF plasma. In some embodiments, the present invention may facilitate one or more of very high target utilization (e.g., 300-800% improvement as compared to target utilization in conventional DC PVD process chambers), more uniform metal ionization, and more uniform deposition on a substrate.

In high pressure RF PVD secondary electron confinement is achieved through oscillation of Ez due to the time varying nature of the RF period and minimal diffusive losses. This provides the main ionization mechanism at the target "cathode" surface and therefore controls the sputtering of metal from the target. Operating at a high gas pressure (e.g., 40-200 mTorr) enables a two mechanism collisional process to play a role to enable a high metal ionization at the wafer: "electron impact" and "penning ionization," with the latter dominating in this setup. However, a magnetron is needed in RF PVD to produce uniform deposition of the sputtered material. In an exemplary application, a magnetic material may be sputtered by a driving frequency of about 40 MHz, which is in the VHF band. As used herein, a VHF frequency is a frequency in the range of from about 27 MHz to about 100 MHz. The geometry of the chamber may be smaller than a typical RF PVD process chamber. For example, the target may be about one inch smaller in diameter and the target to wafer spacing is halved to about 95 mm. Apparatus in accordance with the present invention may provide a higher ionization rate than that shown for conventional RF PVD systems. In addition, the magnetron design disclosed herein may facilitate very high target utilization, as discussed in greater detail below.

Reducing the spacing of the chamber by half allows the target utilization to increase (roughly equal to the inverse of spacing) as more of the sputtered metal arrives at the substrate. However, to further maximize the target utilization a magnet design is provided that can permit more uniform full face erosion without sacrificing desired metal ionization or deposition uniformity. This is not possible in conventional DC PVD or RF PVD process chambers, but has been demonstrated in an exemplary RF PVD process chamber having a magnetron design as described herein.

The magnetron design consists of a plurality of distinct magnetic tracks (e.g., three magnetic tracks) which are all open loop. The magnetic tracks are spaced from near the center to very near the edge. One design utilizes three magnetic tracks where the magnetic tracks have a fixed radius and the length of each track varies as a function of the radial position of the track (e.g., shorter magnetic tracks closer to the center and longer magnetic tracks closer to the edge). In some embodiments, each of the three magnetic tracks are equal in terms of the track length/radial distance, which advantageously facilitates providing more even target erosion. Magnetrons consistent with the above embodiments can increase target efficiency by around 4 times, as compared to conventional DC PVD magnetron designs, but have a limitation for high pressure processes (e.g., >100 mTorr) due to redeposition due to diffusion. In some embodiments, each track is skewed such that there is almost a magnetic pole located across the full face of the target. Such a track configuration provides full face erosion and almost uniform full face erosion. It has been shown that this design can increase target life by a factor of 800% over existing DC PVD process chambers for magnetic materials, whilst exceeding the deposition uniformity and providing twice the ionization levels. This is a significant breakthrough as target utilization is a key metric specified by customers, and is becoming even more important with the increase in use of rare earth materials.

Magnetron designs in accordance with embodiment of the present invention are described below with respect to an illustrative, but non-limiting, PVD process chamber in FIG. 1, and in greater detail in FIGS. 2-3.

FIG. 1 depicts a simplified, cross-sectional view of an illustrative PVD process chamber 100 having a magnetron assembly in accordance with some embodiments of the present invention. The specific configuration of the PVD process chamber is illustrative and PVD process chambers having other configurations may also benefit from modification in accordance with the teachings provided herein. Examples of commercially available PVD process chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufacturers may also benefit from modifications in accordance with the inventive apparatus disclosed herein.

In some embodiments of the present invention, the PVD process chamber 100 includes a chamber lid 101 disposed atop a chamber body 104 and removable from the chamber body 104. The chamber lid 101 generally includes a target assembly 102 and a grounding assembly 103. The chamber body 104 contains a substrate support 106 for receiving a substrate 108 thereon. The substrate support 106 is configured to support a substrate such that a center of the substrate is aligned with a central axis 186 of the PVD process chamber 100. The substrate support 106 may be located within a lower grounded enclosure wall 110, which may be a wall of the chamber body 104. The lower grounded enclosure wall 110 may be electrically coupled to the grounding assembly 103 of the chamber lid 101 such that an RF return path is provided to an RF power source 182 disposed above the chamber lid 101. Alternatively, other RF return paths are possible, such as those that travel from the substrate support 106 via a process kit shield (e.g., a shield 138 as discussed below) and ultimately back to the grounding assembly 103 of the chamber lid 101. The RF power source 182 may provide RF energy to the target assembly 102 as discussed below.

The substrate support 106 has a material-receiving surface facing a principal surface of a target 114 and supports the substrate 108 to be sputter coated with material ejected from the target in planar position opposite to the principal surface of the target 114. The substrate support 106 may include a dielectric member 105 having a substrate processing surface 109 for supporting the substrate 108 thereon. In some embodiments, the substrate support 106 may include one or more conductive members 107 disposed below the dielectric member 105. For example, the dielectric member 105 and the one or more conductive members 107 may be part of an electrostatic chuck, RF electrode, or the like which may be used to provide chucking or RF power to the substrate support 106.

The substrate support 106 may support the substrate 108 in a first volume 120 of the chamber body 104. The first volume 120 is a portion of the inner volume of the chamber body 104 that is used for processing the substrate 108 and may be separated from the remainder of the inner volume (e.g., a non-processing volume) during processing of the substrate 108 (for example, via the shield 138). The first volume 120 is defined as the region above the substrate support 106 during processing (for example, between the target 114 and the substrate support 106 when in a processing position).

In some embodiments, the substrate support 106 may be vertically movable to allow the substrate 108 to be transferred onto the substrate support 106 through an opening (such as a slit valve, not shown) in the lower portion of the chamber body 104 and thereafter raised to a processing position. A bellows 122 connected to a bottom chamber wall 124 may be provided to maintain a separation of the inner volume of the chamber body 104 from the atmosphere outside of the chamber body 104. One or more gases may be supplied from a gas source 126 through a mass flow controller 128 into the lower part of the chamber body 104. An exhaust port 130 may be provided and coupled to a pump (not shown) via a valve 132 for exhausting the interior of the chamber body 104 and to facilitate maintaining a desired pressure inside the chamber body 104.

An RF bias power source 134 may be coupled to the substrate support 106 in order to induce a negative DC bias on the substrate 108. In addition, in some embodiments, a negative DC self-bias may form on the substrate 108 during processing. In some embodiments, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power is not be desired.

The chamber body 104 further includes a process kit shield (shield 138) to surround the processing, or first volume, of the chamber body 104 and to protect other chamber components from damage and/or contamination from processing. In some embodiments, the shield 138 may be coupled to a ledge 140 of an upper grounded enclosure wall 116 of the chamber body 104. In other embodiments, and as illustrated in FIG. 1, the shield 138 may be coupled to the chamber lid 101, for example via a support member 175.

The chamber lid 101 rests on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 101. However, other RF return paths are possible, such as via the grounded shield 138.

The shield 138 extends downwardly and may include one or more sidewalls configured to surround the first volume 120. The shield 138 extends along, but spaced apart from, the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A first ring 148 (e.g., a cover ring) rests on the top of the u-shaped portion (e.g., a first position of the first ring 148) when the substrate support 106 is in its lower, loading position (not shown) but rests on the outer periphery of the substrate support 106 (e.g., a second position of the first ring 148) when the substrate support 106 is in its upper, deposition position (as illustrated in FIG. 1) to protect the substrate support 106 from sputter deposition.

An additional dielectric ring 111 may be used to shield the periphery of the substrate 108 from deposition. For example, the dielectric ring 111 may be disposed about a peripheral edge of the substrate support 106 and adjacent to the substrate processing surface 109 as illustrated in FIG. 1.

When the first ring 148 is in the second position (e.g., when disposed on the outer periphery of the substrate support 106), a gap may be defined between the first ring 148 and the shield 138. In some embodiments, the gap may be less than about two plasma sheath widths for a plasma formed at a frequency of about 40 MHz or higher and at a pressure of about 140 mTorr or lower. In some embodiments, the width of the gap is less than about 6 millimeters (mm). In some embodiments, the gap has a length to width ratio of at least about 4:1. The inventors have discovered that, in some embodiments, a length to width ratio of at least about 4:1 may advantageously limit or prevent plasma formed in the first volume 120 from reaching a non-processing volume of the inner volume disposed below the substrate support 106.

The first ring 148 may include protrusions extending from a lower surface of the first ring 148 on either side of the inner upwardly extending u-shaped portion of the bottom of the shield 138. An innermost protrusion may be configured to interface with the substrate support 106 to align the first ring 148 with respect to the shield 138 when the first ring 148 is moved into the second position as the substrate support is moved into the processing position. For example, a substrate support facing surface of the innermost protrusion may be tapered, notched or the like to rest in/on a corresponding surface on the substrate support 106 when the first ring 148 is in the second position, such that the gap between the first ring 148 and the shield 138 is defined by the alignment of the first ring 148 to be configured as discussed above.

In some embodiments, a magnet 152 may be disposed about the chamber body 104 for selectively providing a magnetic field between the substrate support 106 and the target 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 101 generally includes the grounding assembly 103 disposed about the target assembly 102. The grounding assembly 103 may include a grounding plate 156 having a first surface 157 that may be generally parallel to and opposite a backside of the target assembly 102. A grounding shield 112 may extending from the first surface 157 of the grounding plate 156 and surround the target assembly 102. The grounding assembly 103 may include a support member 175 to support the target assembly 102 within the grounding assembly 103.

In some embodiments, the support member 175 may be coupled to a lower end of the grounding shield 112 proximate an outer peripheral edge of the support member 175 and extends radially inward to support a seal ring 181, the target assembly 102 and optionally, a dark space shield (e.g., than may be disposed between the shield 138 and the target assembly 102, not shown). The seal ring 181 may be a ring or other annular shape having a desired cross-section. The seal ring 181 may include two opposing planar and generally parallel surfaces to facilitate interfacing with the target assembly 102, such as the backing plate 162, on a first side of the seal ring 181 and with the support member 175 on a second side of the seal ring 181. The seal ring 181 may be made of a dielectric material, such as ceramic. The seal ring 181 may insulate the target assembly 102 from the ground assembly 103.

The support member 175 may be a generally planar member having a central opening to accommodate the shield 138 and the target 114. In some embodiments, the support member 175 may be circular, or disc-like in shape, although the shape may vary depending upon the corresponding shape of the chamber lid and/or the shape of the substrate to be processed in the PVD process chamber 100. In use, when the chamber lid 101 is opened or closed, the support member 175 maintains the shield 138 in proper alignment with respect to the target 114, thereby minimizing the risk of misalignment due to chamber assembly or opening and closing the chamber lid 101.

The target assembly 102 may include a source distribution plate 158 opposing a backside of the target 114 and electrically coupled to the target 114 along a peripheral edge of the target 114. The target 114 may include a target source material 113 to be deposited on a substrate, such as the substrate 108 during sputtering, such as a metal, metal oxide, metal alloy, magnetic material, or the like. In some embodiments, the target 114 may include a backing plate 162 to support the target source material 113. The target source material 113 may be disposed on a substrate support facing side of the backing plate 162 as illustrated in FIG. 1. The backing plate 162 may comprise a conductive material, such as copper-zinc, copper-chrome, or the same material as the target, such that RF, and optionally DC, power can be coupled to the target source material 113 via the backing plate 162. Alternatively, the backing plate 162 may be non-conductive and may include conductive elements (not shown) such as electrical feedthroughs or the like.

A conductive member 164 may be disposed between the source distribution plate and the backside of the target 114 to propagate RF energy from the source distribution plate to the peripheral edge of the target 114. The conductive member 164 may be cylindrical and tubular, with a first end 166 coupled to a target-facing surface of the source distribution plate 158 proximate the peripheral edge of the source distribution plate 158 and a second end 168 coupled to a source distribution plate-facing surface of the target 114 proximate the peripheral edge of the target 114. In some embodiments, the second end 168 is coupled to a source distribution plate facing surface of the backing plate 162 proximate the peripheral edge of the backing plate 162.

The target assembly 102 may include a cavity 170 disposed between the backside of the target 114 and the source distribution plate 158. The cavity 170 may at least partially house a magnetron assembly 196 as discussed below. The cavity 170 is at least partially defined by the inner surface of the conductive member 164, a target facing surface of the source distribution plate 158, and a source distribution plate facing surface (e.g., backside) of the target 114 (or backing plate 162). In some embodiments, the cavity 170 may be at least partially filled with a cooling fluid, such as water ($H_2O$) or the like. In some embodiments, a divider (not shown) may be provided to contain the cooling fluid in a desired portion of the cavity 170 (such as a lower portion, as shown) and to prevent the cooling fluid from reaching components disposed on the other side of the divider.

An insulative gap 180 is provided between the grounding plate 156 and the outer surfaces of the source distribution plate 158, the conductive member 164, and the target 114 (and/or backing plate 162). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 should be between about 5 to about 40 mm.

The grounding assembly 103 and the target assembly 102 may be electrically separated by the seal ring 181 and by one or more of insulators 160 disposed between the first surface 157 of the grounding plate 156 and the backside of the target assembly 102, e.g., a non-target facing side of the source distribution plate 158.

The target assembly 102 has the RF power source 182 connected to an electrode 154 (e.g., a RF feed structure). The RF power source 182 may include an RF generator and a matching circuit, for example, to minimize reflected RF energy reflected back to the RF generator during operation. For example, RF energy supplied by the RF power source 182 may range in frequency from about 13.56 MHz and to about 162 MHz or above. For example, non-limiting frequencies such as 13.56 MHz, 27.12 MHz, 60 MHz, or 162 MHz can be used.

In some embodiments, a second energy source 183 may be coupled to the target assembly 102 to provide additional energy to the target 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 102 in any location suitable to electrically couple the DC energy to the target 114, such as the electrode 154 or some other conductive member (such as the source distribution plate 158). In embodiments where the second energy source 183 is a second RF power source, the second energy source may be coupled to the target assembly 102 via the electrode 154.

The electrode 154 may be cylindrical or otherwise rod-like and may be aligned with a central axis 186 of the PVD process chamber 100 (e.g., the electrode 154 may be coupled to the target assembly at a point coincident with a central axis of the target, which is coincident with the central axis 186). The electrode 154, aligned with the central axis 186 of the PVD process chamber 100, facilitates applying RF energy from the RF power source 182 to the target 114 in an axisymmetrical manner (e.g., the electrode 154 may couple RF energy to the target at a "single point" aligned with the central axis of the PVD process chamber). The central position of the electrode 154 helps to eliminate or reduce deposition asymmetry in substrate deposition processes. The electrode 154 may have any suitable diameter, however, the smaller the diameter of the electrode 154, the closer the RF energy application approaches a true single point. For example, although other diameters may be used, in some embodiments, the diameter of the electrode 154 may be about 0.5 to about 2 inches. The electrode 154 may generally have any suitable length depending upon the configuration of the PVD process chamber. In some embodiments, the electrode may have a length of between about 0.5 to about 12 inches. The electrode 154 may be fabricated from any suitable conductive material, such as aluminum, copper, silver, or the like.

The electrode 154 may pass through an opening in the grounding plate 156 and is coupled to a source distribution plate 158. The grounding plate 156 may comprise any suitable conductive material, such as aluminum, copper, or the like. Open spaces between the one or more insulators 160 allow for RF wave propagation along the surface of the source distribution plate 158. In some embodiments, the one or more insulators 160 may be symmetrically positioned with respect to the central axis 186 of the PVD process chamber 100 Such positioning may facilitate symmetric RF wave propagation along the surface of the source distribution plate 158 and, ultimately, to a target 114 coupled to the source distribution plate 158. The RF energy may be provided in a more symmetric and uniform manner as compared to conventional PVD process chambers due, at least in part, to the central position of the electrode 154.

One or more portions of a magnetron assembly 196 may be disposed at least partially within the cavity 170. The magnetron assembly provides a rotating magnetic field proximate the target to assist in plasma processing within the process chamber 104. In some embodiments, the magnetron assembly 196 may include a motor 176, a motor shaft 174, a gearbox 178, a gearbox shaft 184, and a rotatable magnet (e.g., a plurality of magnets 188 coupled to a magnet support member 172).

The magnetron assembly 196 is rotated within the cavity 170. For example, in some embodiments, the motor 176, motor shaft 174, gear box 178, and gearbox shaft 184 may be provided to rotate the magnet support member 172. In some embodiments (not shown), the magnetron drive shaft may be disposed along the central axis of the chamber, with the RF energy coupled to the target assembly at a different location or in a different manner. As illustrated in FIG. 1, in some embodiments, the motor shaft 174 of the magnetron may be disposed through an off-center opening in the grounding plate 156. The end of the motor shaft 174 protruding from the grounding plate 156 is coupled to a motor 176. The motor shaft 174 is further disposed through a corresponding off-center opening through the source distribution plate 158 (e.g., a first opening 146) and coupled to a gear box 178. In some embodiments, one or more second openings 198 may be disposed though the source distribution plate 158 in a symmetrical relationship to the first opening 146 to advantageously maintain axisymmetric RF distribution along the source distribution plate 158. The one or more second openings 198 may also be used to allow access to the cavity 170 for items such as sensors or the like.

The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer 190 between the gear box 178 and the source distribution plate 158, or the like. The gear box 178 is further coupled to the magnet support member 172 via the gear box shaft 184 to transfer the rotational motion provided by the motor 176 to the magnet support member 172 (and hence, the plurality of magnets 188). The gear box shaft 184 may advantageously be coincident with the central axis 186 of the PVD process chamber 100.

The magnet support member 172 may be constructed from any material suitable to provide adequate mechanical strength to rigidly support the plurality of magnets 188. For example, in some embodiments, the magnet support member 172 may be constructed from a non-magnetic metal, such as non-magnetic stainless steel. The magnet support member 172 may have any shape suitable to allow the plurality of magnets 188 to be coupled thereto in a desired position. For example, in some embodiments, the magnet support member 172 may comprise a plate, a disk, a cross member, or the like. The plurality of magnets 188 may be configured in any manner to provide a magnetic field having a desired shape and strength to provide a more uniform full face erosion of the target as described herein.

Alternatively, the magnet support member 172 may be rotated by any other means with sufficient torque to overcome the drag caused on the magnet support member 172 and attached plurality of magnets 188, for example due to the cooling fluid, when present, in the cavity 170. For example, in some embodiments, (not shown), the magnetron assembly 196 may be rotated within the cavity 170 using a motor 176 and motor shaft 174 disposed within the cavity 170 and directly connected to the magnet support member 172 (for example, a pancake motor). The motor 176 must be sized sufficiently to fit within the cavity 170, or within the upper portion of the cavity 170 when the divider is present. The motor 176 may be an electric motor, a pneumatic or hydraulic drive, or any other process-compatible mechanism that can provide the required torque.

Figure 2:
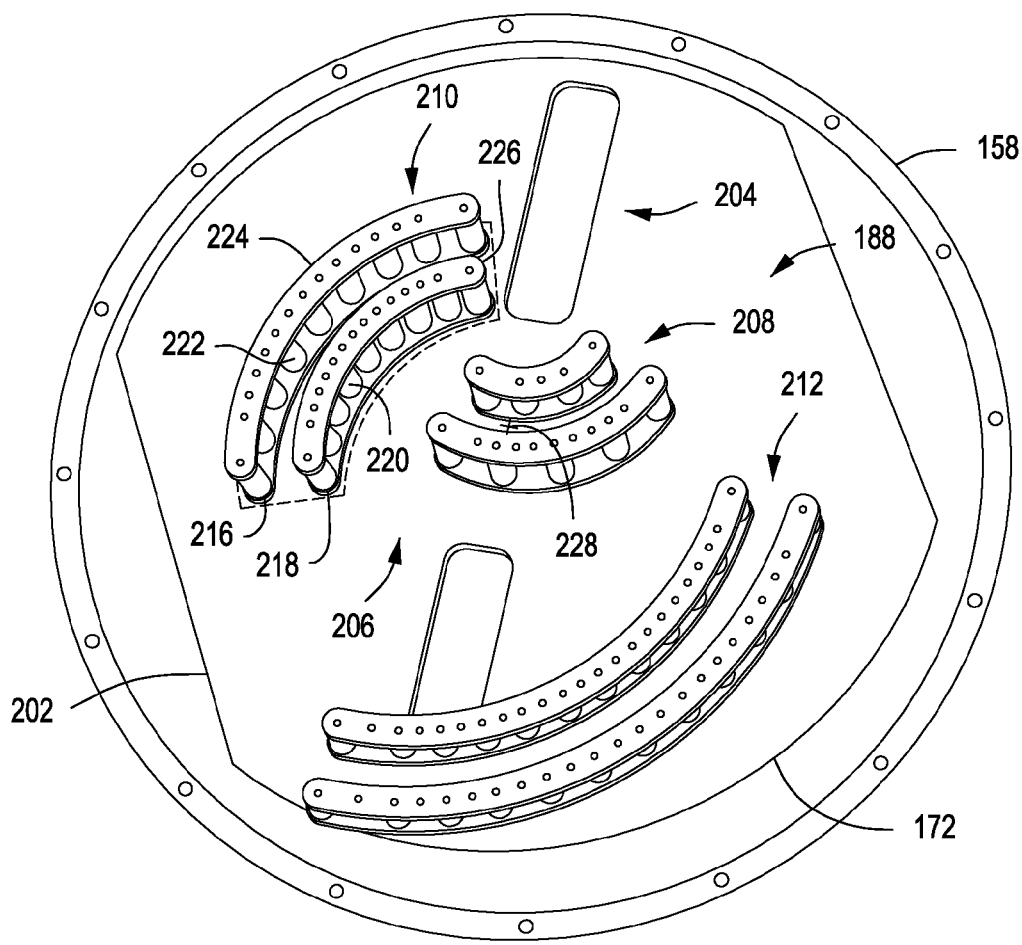
FIG. 2 depicts a bottom perspective view of a magnet assembly for use in a PVD process chamber in accordance with some embodiments of the present invention.
Figure 3:
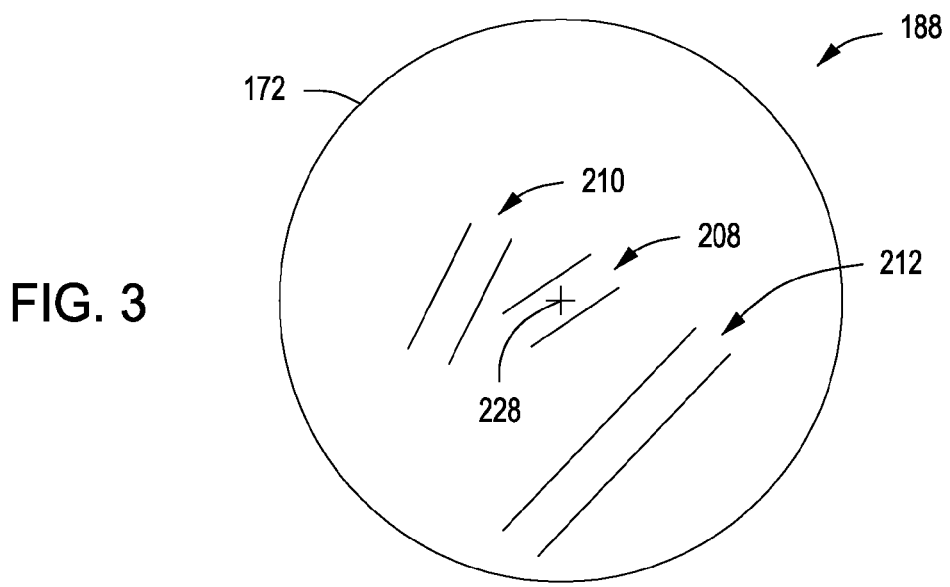
FIG. 3 depicts a bottom schematic view of a magnet assembly for use in a PVD process chamber in accordance with some embodiments of the present invention.

FIG. 2 depicts a bottom perspective view of a magnet assembly (e.g., a configuration of the plurality of magnets 188 of the magnetron) for use in a PVD process chamber in accordance with some embodiments of the present invention. As shown in FIG. 2, the magnet support member 172, which serves as a structural base for the magnet assembly, has the plurality of magnets 188 coupled thereto. The magnet support member 172 may be fabricated of a suitable material to be a shunt plate that shunts the magnetic field. The magnet support member may also include a central opening and a mounting plate for mounting the magnet support member 172 to a shaft to provide rotation of the magnetron during use, for example, such as the rotation shaft 184 as shown in FIG. 1. The magnet support member 172 may also have cut-outs or material removed, such as shown by 202 and 204, to reduce the mass of the magnet support member 172.

The plurality of magnets 188 may be arranged into a plurality of distinct pairs of open loop magnetic poles, or magnetic tracks 206, coupled to the magnet support member 172. The magnetic tracks 206 may be coupled to the magnet support member 172, for example, via a plurality of mounting holes formed in the magnet support member 172. In the embodiment depicted in FIG. 2 three pairs of magnetic tracks 208, 210, 212 are shown. The magnetic tracks are spaced from near the center to their the edge. By providing a plurality of magnetic tracks spaced on the magnet support member from near the center to near the edge, a magnetic field may be produced the covers or substantially covers the full face of the target. In some embodiments, the magnetic tracks may be curved and may have a fixed radius. In some embodiments the magnetic tracks may have a varying radius. In some embodiments, and as depicted in FIG. 3, the magnetic tracks may be linear. In any of the embodiments described herein, the magnetic tracks may be linear rather than curved.

The plurality of magnetic tracks may generally be positioned with one magnetic track near the center of the magnet support member 172 (e.g., near the center of the target source material 113), and one magnetic track in a position corresponding to the outer edge of the target source material 113. In some embodiments, the magnetic track positioned near the center may have the poles disposed on either side of the center of the magnet support member, but with neither pole directly over the center. Any additional magnetic tracks may be positioned to fill the spaces in between the center and edge.

In some embodiments, the magnetic tracks may have a length that varies as a function of the radial location of the track. In some embodiments, a ratio of track length to the radial distance of the track from the center of the magnet support member 172 is substantially equal for each of the magnetic tracks. This may advantageously provide a more uniform erosion of the target.

The pairs of open loop magnetic poles (e.g., magnetic tracks 208, 210, 212) each include a first open loop magnetic pole track (e.g., 216) and a second open loop magnetic pole track (e.g., 218). In some embodiments, one or more of respective central axes of the magnetic tracks are not coincident with a center of rotation 228 of the magnetic support member 172. For example, in some embodiments one or more, or in some embodiments all, of the magnetic tracks may be skewed such that a center of curvature for each track is not coincident with the center of rotation 228 of the magnetic support member 172.

The first open loop magnetic pole track 216 may include a first pole piece 224, which may be formed in the shape of an arc, and a plurality of magnets 222 disposed between the first pole piece 224 and the magnetic support member 172. The second open loop magnetic pole track 218 may be coupled to the magnetic support member 172 at a first distance from the first open loop magnetic pole track 216. The second open loop magnetic pole track 218 includes a second pole piece 226, which may be formed in the shape of an arc, and a plurality of magnets 220 disposed between the second pole piece 226 and the magnetic support member 172.

The pluralities of magnets 222, 220 do not need to be distributed along the entire length of the respective first and second pole pieces 224, 226 or evenly along the length of the pole piece. For example, the number and/or distribution of magnets about the length of the first or second pole piece may be adjusted to change magnetic field strength and/or facilitate improved target lifetime and/or deposition uniformity. In some embodiments, where the plurality of magnets are not distributed along the entire length of the first or second pole piece, one or more spacers (not shown) may be provided to support the ends of the respective pole piece. However, the overall magnetic strength of each of the first and second open loop magnetic pole tracks 216, 218 may be the same or substantially the same. For example, a balance ratio (i.e., a ratio of the magnetic field strength of the inner track to the outer track) may be between about 0.75 to about 1.25, or in some embodiments, about 1. Providing a more balanced ratio of magnetic field strengths advantageously minimizes magnetic field lines extending in the z direction (e.g., perpendicular to the magnetic support member 172).

In some embodiments, the magnetic field provided by the magnetron is relatively weak, meaning just strong enough to provide confinement. For use with magnetic target materials, the magnetic field may be stronger, and for use with non-magnetic target materials, the magnetic field may be weaker. Similarly, the spacing between pairs of poles in a given track may be selected based upon the overall thickness of the target (e.g., the target source material 113 the backing plate 162). In some embodiments, the overall thickness of the target may be about one inch. The spacing may be selected such that the magnetic field extends just to the face of the target source material 113, or slightly into the processing volume beyond the face of the target source material 113.

Generally, the first and second pole pieces 224, 226 may be fabricated from a ferromagnetic material, such as in a non-limiting example, 400-series stainless steel or other suitable materials. The arc lengths of each of the first and second pole pieces 224, 226 may range in arc length from about 45 degrees to about 180 degrees, or from about 80 to about 100 degrees, or about 90 degrees. The above description with respect to the pair of magnetic tracks 210 also applies to the remaining pairs of magnetic tracks as well.

The polar orientation, or polarity (e.g., north or south), within a given track in any pair of open loop magnetic poles is the same (e.g., the magnets within a given open loop magnetic pole track have a common polar orientation), but the polarity between pairs of magnetic tracks is opposite (e.g., inner north and outer south or inner south and outer north).

While the foregoing is directed to embodiments of the present invention, other and further embodiments of the invention may be devised without departing from the basic scope thereof.

The invention claimed is:

1. A magnetron for use in a process chamber, comprising:
a support member having a center of rotation; and
a plurality of magnetic tracks coupled to the support member in a fixed orientation, each track comprising a pair of open loop magnetic poles that are parallel to and spaced apart from each other,
wherein a length of each magnetic track increases as a distance between each magnetic track and a center of the support member increases.

2. The magnetron of claim 1, wherein the plurality of magnetic tracks consist of three magnetic tracks.

3. The magnetron of claim 1, wherein each pair of open loop magnetic poles in each magnetic track comprises a plurality of magnets.

4. The magnetron of claim 3, wherein each magnet in the plurality of magnets in a given open loop magnetic pole has a common polar orientation.

5. The magnetron of claim 4, wherein the polar orientations of each open loop magnetic pole in a given track are opposite each other.

6. The magnetron of claim 1, wherein the open loop magnetic poles in each track have a balance ratio of about 0.75 to about 1.25.

7. The magnetron of claim 1, wherein one or more of the plurality of magnetic tracks are linear.

8. The magnetron of claim 1, wherein one or more of the plurality of magnetic tracks are curved.

9. The magnetron of claim 1, wherein the plurality of magnetic tracks are curved, and wherein a center of curvature of each of the plurality of magnetic tracks is not coincident with a center of rotation of the support member.

10. A substrate processing system, comprising:
a process chamber having an inner volume and a substrate support disposed therein;
a target assembly disposed in an upper portion of the inner volume opposing the substrate support; and
a magnetron disposed proximate the target assembly on a side opposite the substrate support, the magnetron comprising:
a support member having a center of rotation; and
a plurality of magnetic tracks coupled to the support member in a fixed orientation, each track comprising a pair of open loop magnetic poles that are parallel to and spaced apart from each other, wherein a length of each magnetic track increases as a distance between each magnetic track and a center of the support member increases.

11. The substrate processing system of claim 10, wherein the plurality of magnetic tracks consist of three magnetic tracks.

12. The substrate processing system of claim 10, wherein each pair of open loop magnetic poles in each magnetic track comprises a plurality of magnets.

13. The substrate processing system of claim 12, wherein each magnet in the plurality of magnets in a given open loop magnetic pole has a common polar orientation.

14. The substrate processing system of claim 13, wherein the polar orientations of each open loop magnetic pole in a given track are opposite each other.

15. The substrate processing system of claim 10, wherein the open loop magnetic poles in each track have a balance ratio of about 0.75 to about 1.25.

16. The substrate processing system of claim 10, wherein one or more of the plurality of magnetic tracks are linear.

17. The substrate processing system of claim 10, wherein one or more of the plurality of magnetic tracks are curved.

18. The substrate processing system of claim 10, wherein the plurality of magnetic tracks are curved, and wherein a center of curvature of each of the plurality of magnetic tracks is not coincident with a center of rotation of the support member.

19. The magnetron of claim 1, wherein one track is disposed near the center of the support member and wherein a different track is disposed in a position corresponding to an outer edge of a target material to be deposited on a substrate when the magnetron is installed in the process chamber.

20. The substrate processing system of claim 10, wherein one track is disposed near the center of the support member and wherein a different track is disposed in a position corresponding to an outer edge of a target material to be deposited on a substrate when installed in the process chamber.

* * * * *